(12) United States Patent
Xie et al.

(10) Patent No.: US 12,396,227 B2
(45) Date of Patent: Aug. 19, 2025

(54) FULL WRAP AROUND BACKSIDE CONTACT

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Junli Wang, Slingerlands, NY (US); Julien Frougier, Albany, NY (US); Min Gyu Sung, Latham, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 498 days.

(21) Appl. No.: 17/899,948

(22) Filed: Aug. 31, 2022

(65) Prior Publication Data

US 2024/0072116 A1 Feb. 29, 2024

(51) Int. Cl.
| | |
|---|---|
| *H10D 62/13* | (2025.01) |
| *B82Y 10/00* | (2011.01) |
| *H01L 21/285* | (2006.01) |
| *H01L 21/768* | (2006.01) |
| *H01L 23/48* | (2006.01) |

(Continued)

(52) U.S. Cl.
CPC ......... *H10D 62/151* (2025.01); *H01L 23/481* (2013.01); *H10D 30/43* (2025.01); *H10D 30/6757* (2025.01); *H10D 62/116* (2025.01); *H10D 62/121* (2025.01)

(58) Field of Classification Search
CPC ........... H01L 23/5286; H01L 21/28518; H01L 21/76897; H01L 23/481; H10D 30/797; H10D 84/0149; H10D 30/0212; H10D 64/254; H10D 30/0198; H10D 64/251; H10D 30/6757; H10D 30/6735; H10D 62/116

See application file for complete search history.

(56) References Cited

U.S. PATENT DOCUMENTS

| | | |
|---|---|---|
| 9,570,395 B1 | 2/2017 | Sengupta et al. |
| 9,847,390 B1 | 12/2017 | Xie et al. |

(Continued)

FOREIGN PATENT DOCUMENTS

| | | |
|---|---|---|
| CN | 113053820 A | 6/2021 |
| EP | 3671825 A1 | 6/2020 |
| WO | 2018004653 A1 | 1/2018 |

OTHER PUBLICATIONS

International Search Report from PCT/EP2023/071820 dated Jan. 4, 2024. (19 pages).

(Continued)

*Primary Examiner* — Sonya McCall-Shepard
(74) *Attorney, Agent, or Firm* — Tutunjian & Bitetto, P.C.; Matt Zehrer

(57) ABSTRACT

A semiconductor structure is presented including a first source/drain (S/D) epi region having a first contact completely wrapping around the first S/D epi region, the first contact electrically connected to a backside power delivery network (BSPDN) and a second S/D epi region having a second contact directly contacting a first sidewall, a second sidewall, and a top surface of the second S/D epi region, the second contact electrically connected to back-end-of-line (BEOL) components.

18 Claims, 17 Drawing Sheets

(51) Int. Cl.
    *H01L 23/528* (2006.01)
    *H10D 30/01* (2025.01)
    *H10D 30/43* (2025.01)
    *H10D 30/67* (2025.01)
    *H10D 62/10* (2025.01)
    *H10D 64/01* (2025.01)
    *H10D 64/23* (2025.01)

(56) References Cited

U.S. PATENT DOCUMENTS

| | | | |
|---|---|---|---|
| 10,192,867 | B1 | 1/2019 | Frougier et al. |
| 10,586,765 | B2 | 3/2020 | Smith et al. |
| 10,636,739 | B2 | 4/2020 | Beyne et al. |
| 10,700,207 | B2 | 6/2020 | Chen et al. |
| 11,211,452 | B1 | 12/2021 | Xie et al. |
| 11,264,274 | B2 | 3/2022 | Smith et al. |
| 11,264,493 | B2 | 3/2022 | Morrow et al. |
| 2018/0219090 | A1 | 8/2018 | Morrow et al. |
| 2020/0105671 | A1 | 4/2020 | Lai et al. |
| 2020/0219997 | A1 | 7/2020 | Mehandru et al. |
| 2020/0294860 | A1 | 9/2020 | Chang et al. |
| 2021/0336019 | A1 | 10/2021 | Su et al. |
| 2022/0157985 | A1 | 5/2022 | Song et al. |
| 2022/0208679 | A1 | 6/2022 | Lee et al. |
| 2022/0262791 | A1* | 8/2022 | Shi ............ H10D 62/119 |
| 2023/0197815 | A1* | 6/2023 | Huang ............ H10D 84/83 257/288 |

OTHER PUBLICATIONS

James Dick, "Pat Gelsinger Takes us on a Trip Down Memory Lane—and a Look Ahead", Tech Insights, 2022, 11 pages.

Mathur et al., "Buried Bitline for sub-5nm SRAM Design", 2020 IEEE International Electron Devices Meeting (IEDM), Mar. 11, 2021, 04 pages.

Prasad et al., "Buried Power Rails and Back-side Power Grids: Arm® CPU Power Delivery Network Design Beyond 5nm", 2019 IEEE International Electron Devices Meeting (IEDM), Feb. 13, 2020, 04 pages.

* cited by examiner

ID="1" />
FULL WRAP AROUND BACKSIDE CONTACT

BACKGROUND

The present invention relates generally to semiconductor devices, and more specifically, to constructing a full wrap around backside contact.

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node.

With the increased demands for miniaturization, higher speed, greater bandwidth, lower power consumption, and lower latency, chip layout has become more complicated and difficult to achieve in the production of semiconductor dies.

Fin-based active devices, primarily transistors, are extensively applied for the production of standard cells and other active device configurations processed in the front-end-of-line (FEOL) part of the integrated circuit fabrication process, and include FinFETs, as well as more recent devices based on nanowires or nanosheets. An example technology involves the use of buried interconnect rails in the FEOL. Buried power rails (BPRs) can directly connect the transistors in the FEOL to a power delivery network located entirely on the back side of an integrated circuit chip. In particular, the source or drain area of a number of transistors are directly connected to a buried rail. The current practice for realizing this configuration is to produce an interconnect via to the buried rail, and to couple the interconnect via to the source or drain area through a local interconnect that is part of the source/drain contact level of the chip, also referred to as the "middle end of line," which is a transition between the active devices in the FEOL, and the interconnect levels (M1, M2, etc.,) in the back-end-of-line (BEOL).

Some implementations of this approach have a number of drawbacks. As the rails are buried underneath the active devices, the size of the buried power rail (BPR) is limited by the cell-to-cell space between two nearby active regions. As cell height scales down, so does the cell-to-cell space, the buried power rail size decreases, and its resistance increases, which degrades the circuit performance.

To achieve better performance, contact optimization over the source/drain (S/D) epitaxy is needed, especially for FinFET technology and other technologies beyond FinFET, such as nanosheet, where the S/D epi can be tall, and a wrap around contact which contacts not only the top and also the sidewall surfaces of the S/D epi can improve the contact area and reduce the contact resistance. Contact resistance is a contributor of the total resistance of a transistor as transistor device scaling continues beyond (e.g., below) the 10 nanometer (nm) technology node. The term "contact resistance" is a measure of the ease with which current can flow across a metal-semiconductor interface. Contact resistivity (RhoC) reduction alone is not enough to reduce external resistance to its target for 10 nm technology node and beyond, and a new contact structure is needed to increase the contact area. The wrap around contact (WAC) can be considered an ideal contact structure. However, the WAC has been difficult to achieve during certain semiconductor manufacturing processes.

SUMMARY

In accordance with an embodiment, a semiconductor structure is provided. The semiconductor structure includes a first source/drain (S/D) epi region having a first contact completely wrapping around the first S/D epi region, the first contact electrically connected to a backside power delivery network (BSPDN) and a second S/D epi region having a second contact directly contacting a first sidewall, a second sidewall, and a top surface of the second S/D epi region, the second contact electrically connected to back-end-of-line (BEOL) components.

In accordance with another embodiment, a semiconductor structure is provided. The semiconductor structure includes a first source/drain (S/D) epi region having a salicide wrapping and a silicide wrapping, and a first contact wrapping around the silicide wrapping of the first S/D epi region, the first contact electrically connected to a backside power delivery network (BSPDN) and a second S/D epi region having a partial salicide wrapping, and a second contact electrically connected to back-end-of-line (BEOL) components.

In accordance with yet another embodiment, a semiconductor structure is provided. The semiconductor structure includes a first source/drain (S/D) epi region having a partial silicide wrapping, and a first contact wrapping around the silicide wrapping of the first S/D epi region and a second S/D epi region having a partial salicide wrapping, and a second contact that is prevented from extending along sidewalls of the second S/D epi region.

In one preferred aspect, a bottom surface of the second S/D epi region directly contacts a buried oxide layer.

In another preferred aspect, the buried oxide layer is horizontally aligned with a portion of the first contact.

In yet another preferred aspect, the first contact is vertically offset from the second contact.

In one preferred aspect, the first S/D epi region is horizontally aligned with the second S/D epi region.

In another preferred aspect, the first S/D epi region and the second S/D epi region are both n-type epi regions.

In yet another preferred aspect, the first S/D epi region and the second S/D epi region are both p-type epi regions.

In one preferred aspect, the partial salicide wrapping of the second S/D epi region directly contacts the second contact.

In another preferred aspect, the silicide wrapping of the first S/D epi region directly contacts the first contact.

In another preferred aspect, the first contact is electrically connected to a backside power delivery network (BSPDN) and the second contact is electrically connected to back-end-of-line (BEOL) components.

The advantages of the present invention include producing transistors that consume less power, have better performance, occupy less area on a wafer, and reduce cost in semiconductor manufacturing. The advantages of the present invention further include improving the backside contact for backside power rail and backside power delivery network technology by increasing the silicide area. The silicide area is advantageously positioned around select S/D epi regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a full wrap around backside contact. In nanosheet field effect transistors (FETs), a wrap-around contact (WAC) may be formed over the entire outer surface of source/drain regions in order to reduce resistance in the nanosheet FET. In previous methods, in order to ensure that the WAC is formed around the entire outer surface of the source/drain regions, a large contact area is etched over the source/drain regions such that each outer surface of the source/drain regions is exposed, even in a worst-case misalignment scenario. In order to ensure that the WAC is formed around the entire outer surface of the source/drain regions at the worst-case alignment scenario using previous methods, the contact area is made significantly wider than the nanosheets. The large contact area limits the device scaling because the space between individual nanosheet stacks is limited by the width of the contact area used to form the WAC.

The exemplary embodiments of the present invention present a backside wrap around contact, which advantageously increases the silicide area to mitigate conventional issues such as higher contact resistance because high temperature anneal cannot be performed when back-end-of-line (BEOL) interconnects are built on the front side of the wafer. The exemplary embodiments of the present invention advantageously form a silicide wrapping around the source/drain (S/D) epi. Stated differently, the present invention improves the backside contact for backside power rail and backside power delivery network technology by advantageously increasing the silicide area. The silicide area is advantageously positioned around select S/D epi regions.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
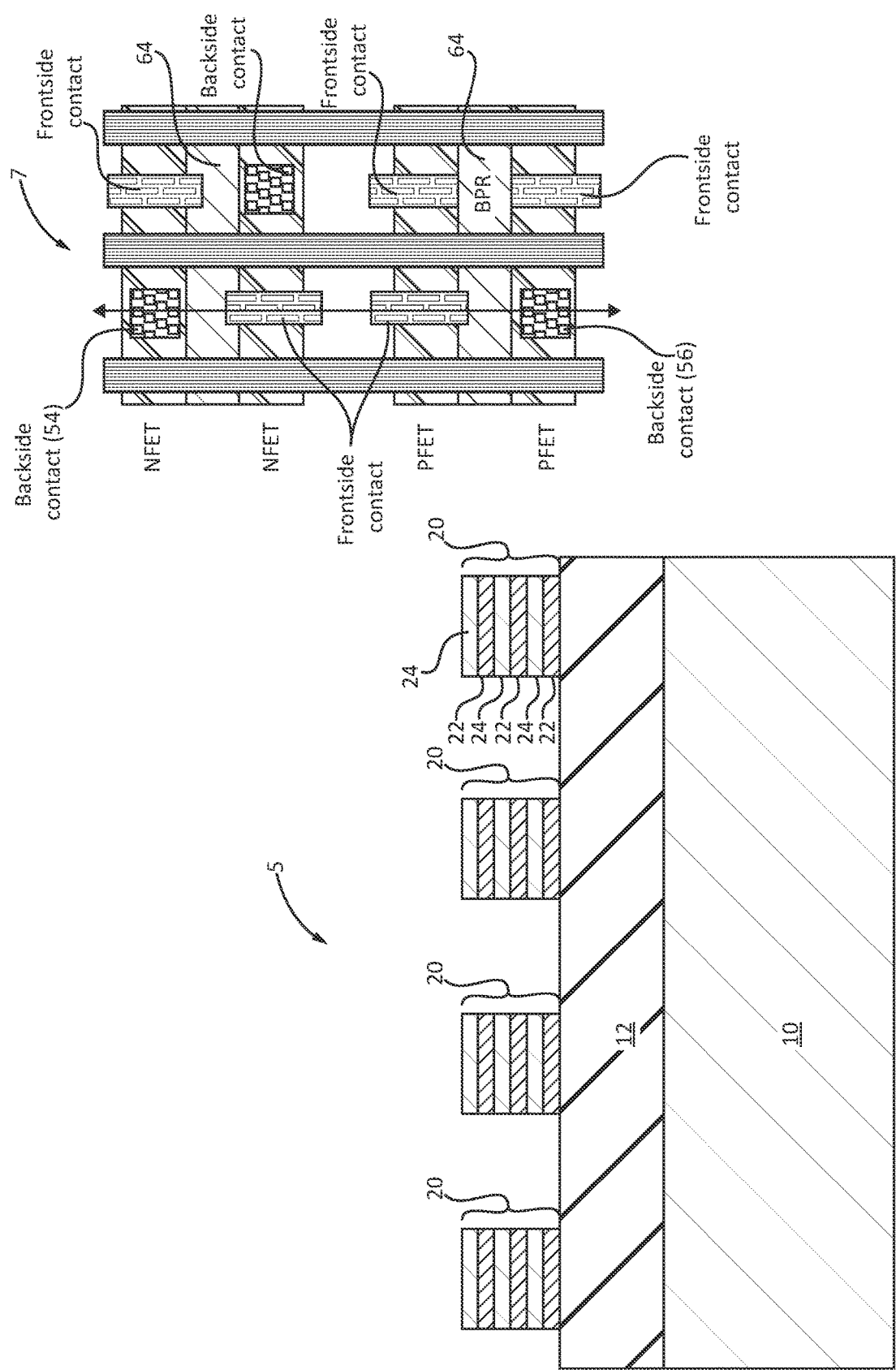
FIG. 1 is a cross-sectional view of a semiconductor structure including nanosheet stacks formed over a substrate, in accordance with an embodiment of the present invention.

FIG. 1 is a cross-sectional view of a semiconductor structure including nanosheet stacks formed over a substrate, in accordance with an embodiment of the present invention.

In various example embodiments, structure 5 includes a nanosheet stack 20 formed over a substrate 10. A buried oxide (BOX) layer 12 can be formed between the substrate 10 and the nanosheet stack 20. The nanosheet stack 20 includes alternating layers of a first semiconductor material (or layer) 22 and a second semiconductor material (or layer) 24. The first semiconductor material 22 can be, e.g., silicon germanium (SiGe) and the second semiconductor material 24 can be, e.g., silicon (Si).

The top view 7 illustrates the NFETs and PFETs in relation to the backside power rail 64.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Referring to, e.g., the nanosheet stack 20, the first semiconductor material 22 can be the first layer in a stack of sheets of alternating materials. The nanosheet stack 20 thus includes first semiconductor materials (or layers) 22 and second semiconductor materials (or layers) 24. Although it is specifically contemplated that the first semiconductor materials 22 can be formed from silicon germanium and that the second semiconductor materials 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor materials 22/24 can be deposited by any appropriate mechanism. It is specifically contemplated that the first and second semiconductor materials 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

Figure 2:
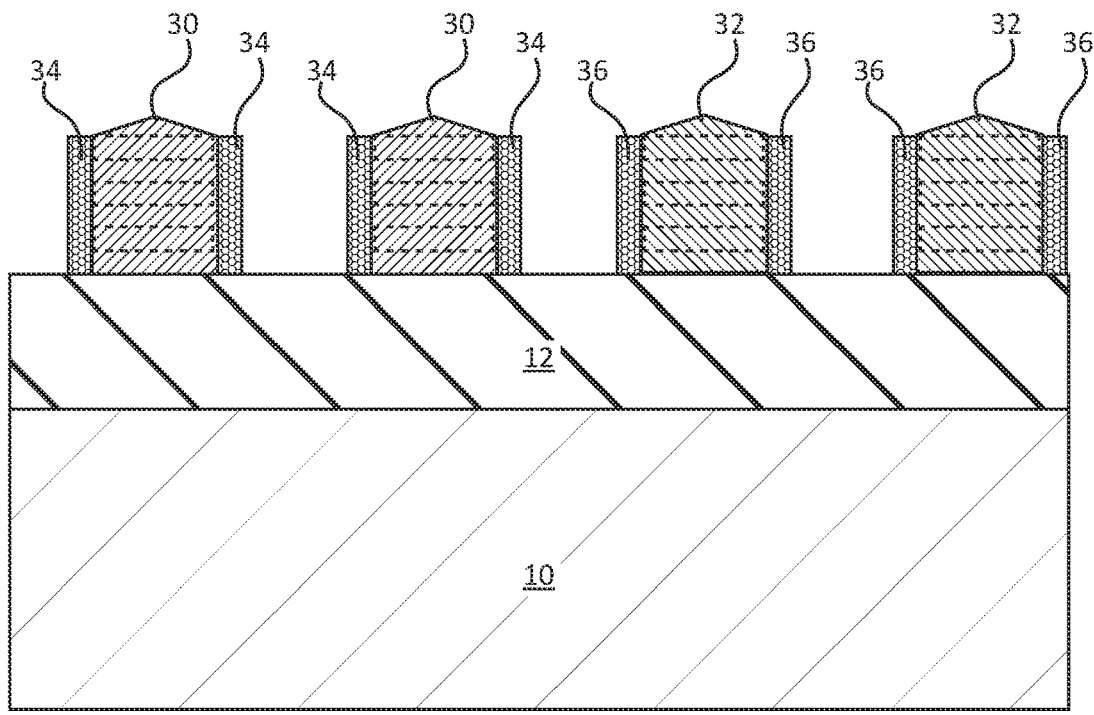
FIG. 2 is a cross-sectional view of the semiconductor structure of FIG. 1 where dummy gates and gate spacers (not shown) are formed, and the nanosheets stacks between the gate spacers are removed, followed by SiGe indentation and inner spacer formation (not shown), and formation of the source/drain epi regions, in accordance with an embodiment of the present invention.

FIG. 2 is a cross-sectional view of the semiconductor structure of FIG. 1 where dummy gates and gate spacers (not shown) are formed, and the nanosheets stacks between the gate spacers are removed, followed by SiGe indentation and inner spacer formation (not shown), and formation of the source/drain epi regions, in accordance with an embodiment of the present invention.

In various example embodiments, spacers 34, 36 are formed at sidewalls of the gates (not shown) and sidewalls of the nanosheets stacks 20, and then the nanosheets stacks 20 are removed and replaced with source/drain (S/D) epi regions 30, 32. In one example, n-type S/D epi regions 30 are formed and p-type S/D epi regions 32 are formed. The spacers 34 directly contact the n-type S/D epi regions 30 and the spacers 36 directly contact the p-type S/D epi regions 32.

Source/drain epi regions 30, 32 can be of the same or different materials for pFET and nFET devices, and can be either in-situ doped with appropriate polarity dopants (B for pFET and P for nFET devices) or doped by ion implantation.

The spacers 34, 36 can include any of one or more of SiN, SiBN, SiCN and/or SiBCN films.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {1001 crystal surface will take on a (100}orientation.

Figure 3:
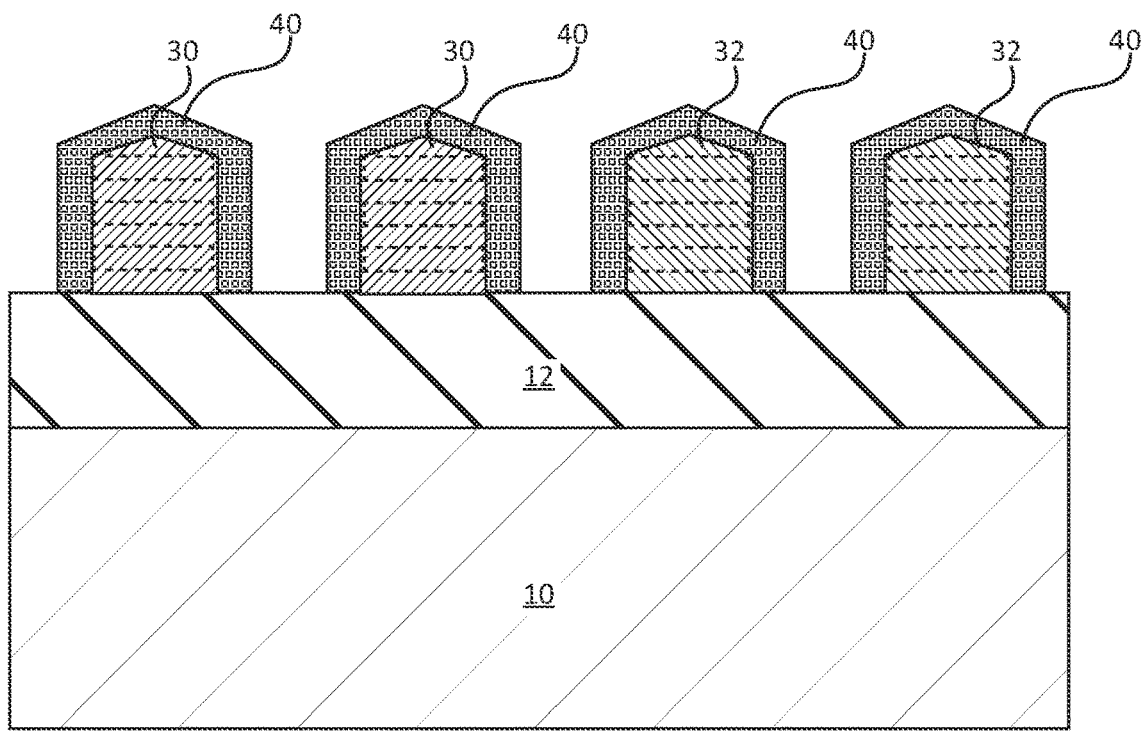
FIG. 3 is a cross-sectional view of the semiconductor structure of FIG. 2 where the spacers are removed and a sacrificial liner is selectively formed over the source/drain epi regions, in accordance with an embodiment of the present invention.

FIG. 3 is a cross-sectional view of the semiconductor structure of FIG. 2 where the spacers are removed and a sacrificial liner is selectively formed over the source/drain epi regions, in accordance with an embodiment of the present invention.

In various example embodiments, the spacers 34, 36 are removed and a sacrificial liner 40 is selectively formed over the source/drain epi regions 30, 32. The sacrificial liner 40 completely surrounds the source/drain epi regions 30, 32.

In one example, the sacrificial liner 40 can be, e.g., SiGe with high Ge % or titanium nitride (TiN).

Figure 4:
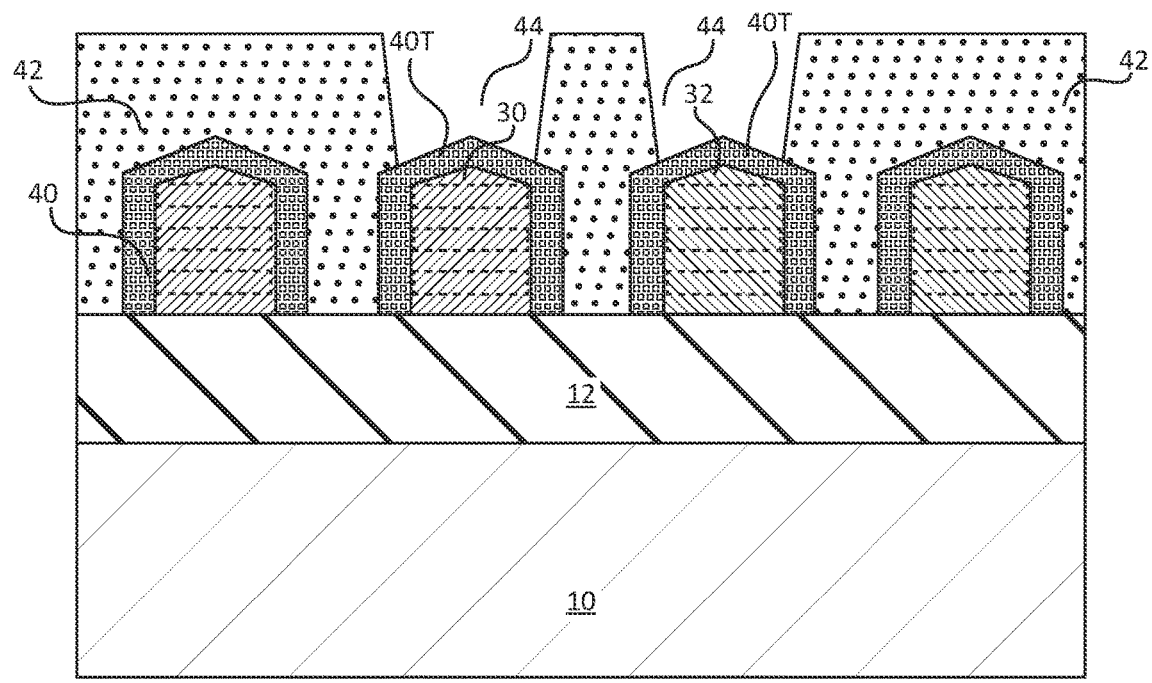
FIG. 4 is a cross-sectional view of the semiconductor structure of FIG. 3 where an interlayer dielectric (ILD) is deposited, followed by dummy gate and sacrificial SiGe layer removal inside the gate region (not shown), and after that, a replacement high-k metal gate (HKMG) is formed to wrap around the nanosheet channels inside the gate (not shown), and then contact openings are formed over at least one n-type source/drain epi region and at least one p-type S/D epi region, in accordance with an embodiment of the present invention.

FIG. 4 is a cross-sectional view of the semiconductor structure of FIG. 3 where an interlayer dielectric (ILD) is deposited, followed by dummy gate and sacrificial SiGe layer 22 removal inside the gate region (not shown). After that, a replacement high-k metal gate (HKMG) is formed to wrap around the nanosheet channels inside the gate (not shown), and then contact openings are formed over at least one n-type source/drain epi region and at least one p-type S/D epi region, in accordance with an embodiment of the present invention.

In various example embodiments, an interlayer dielectric (ILD) 42 is deposited and contact openings 44 are formed over at least one n-type source/drain epi region 30 and at least one p-type epi region 32. The contact openings 44 expose top surfaces 40T of the sacrificial liner 40. One top surface 40T corresponds to an n-type source/drain epi region 30 and another top surface 40T corresponds to a p-type source/drain epi region 32.

The ILD 42 can be any suitable material, such as, for example, porous silicates, carbon doped oxides, silicon dioxides, silicon nitrides, silicon oxynitrides, or other dielectric materials. Any known manner of forming the ILD 42 can be utilized. The ILD 42 can be formed using, for example, CVD, PECVD, ALD, flowable CVD, spin-on dielectrics, or PVD.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 5:
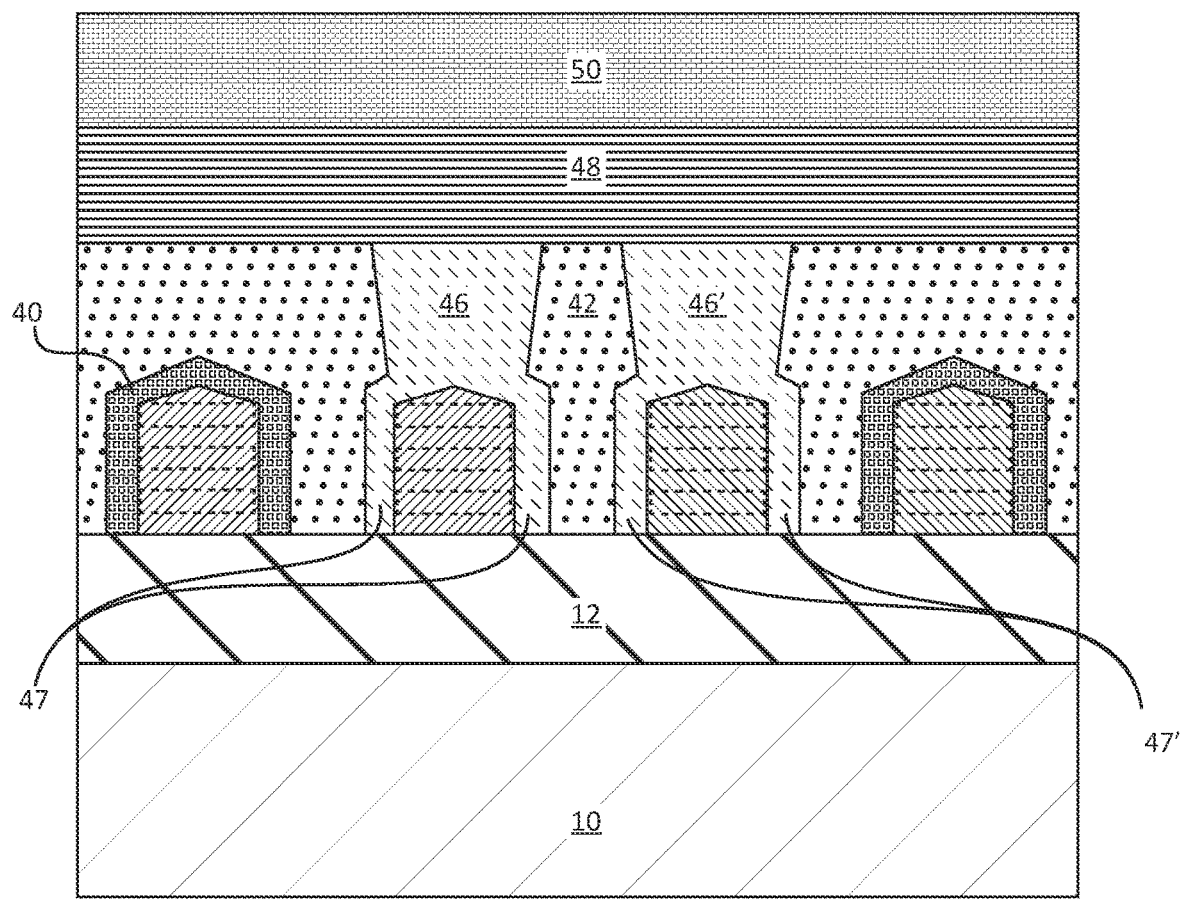
FIG. 5 is a cross-sectional view of the semiconductor structure of FIG. 4 where the exposed sacrificial liner is removed, CA contacts are formed, back-end-of-line (BEOL) processing takes place, and a carrier wafer is bonded to the BEOL, in accordance with an embodiment of the present invention.

FIG. 5 is a cross-sectional view of the semiconductor structure of FIG. 4 where the exposed sacrificial liner is removed, CA contacts are formed, back-end-of-line (BEOL) processing takes place, and a carrier wafer is bonded to the BEOL, in accordance with an embodiment of the present invention.

In various example embodiments, the exposed sacrificial liner is removed and CA contacts 46, 46' are formed. CA contacts are S/D contacts. Then back-end-of-line (BEOL) processing 48 takes place and a carrier wafer 50 is bonded to the BEOL 48. The BEOL 48 can include various components. The CA contact 46 includes extensions 47 to surround the sidewalls of the n-type source/drain epi region 30, whereas the CA contact 46' includes extensions 47' to surround the sidewalls of the p-type source/drain epi region 32. It is noted that the CA contact 46 does not directly contact the bottom surface of the n-type source/drain epi region 30 and that the CA contact 46' does not directly contact the bottom surface of the p-type source/drain epi region 32. Instead, the bottom surface of the n-type source/drain epi region 30 directly contacts the BOX layer 12 and the bottom surface of the p-type source/drain epi region 32 directly contacts the BOX layer 12. Therefore, the CA contact 46 advantageously directly contacts three surfaces of the n-type source/drain epi region 30 and the CA contact 46' advantageously directly contacts three surfaces of the p-type source/drain epi region 32.

This can be referred to as middle-of-line (MOL) contact metallization.

Non-limiting examples of suitable conductive materials for the CA contacts 46, 46' include a silicide liner, such as Ti, Ni, NiPt, etc., a metal adhesion liner, such as TiN, TaN, Ru, and conductive metal fill such as W, Al, Co, Ru, Cu, etc. The conductive material can further include dopants that are incorporated during or after deposition. The conductive metal can be deposited by a suitable deposition process, for example, CVD, PECVD, PVD, plating, thermal or e-beam evaporation, and sputtering.

Figure 6:
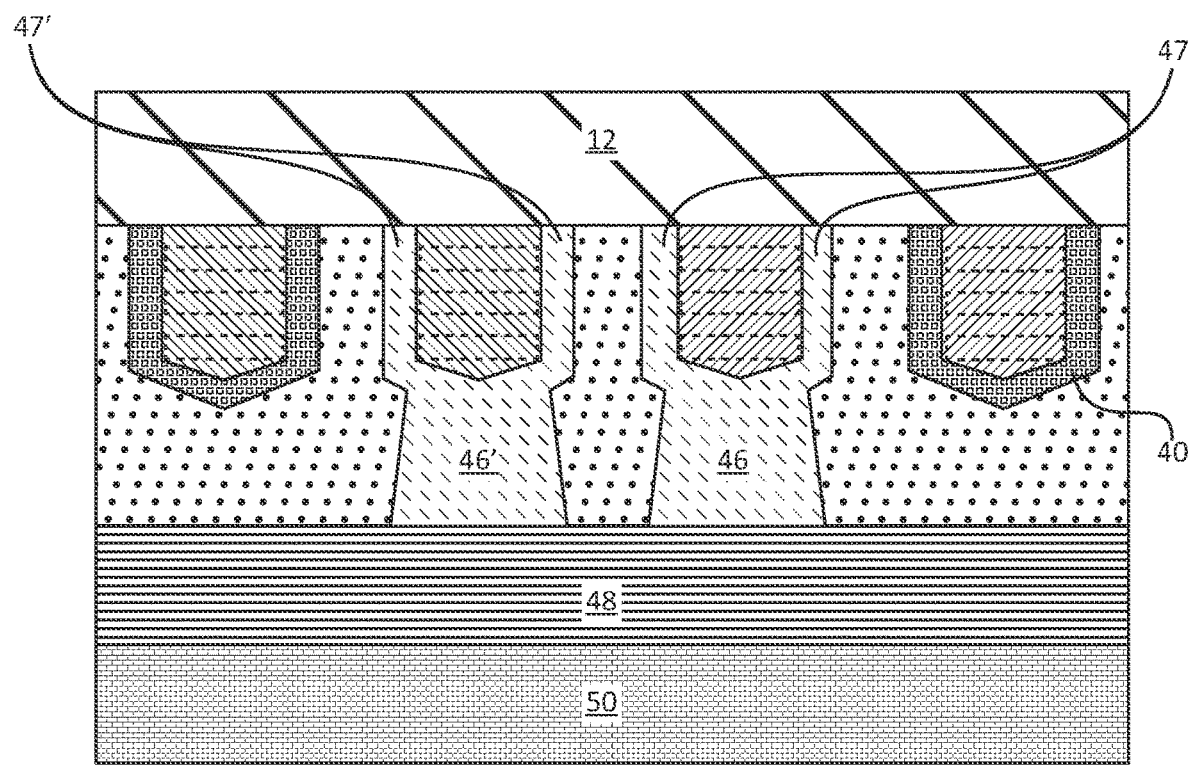
FIG. 6 is a cross-sectional view of the semiconductor structure of FIG. 5 where the structure is flipped and the substrate is removed, in accordance with an embodiment of the present invention.

FIG. 6 is a cross-sectional view of the semiconductor structure of FIG. 5 where the structure is flipped and the substrate is removed, in accordance with an embodiment of the present invention.

In various example embodiments, the structure is flipped and the substrate 10 is removed to expose the BOX layer 12.

Figure 7:
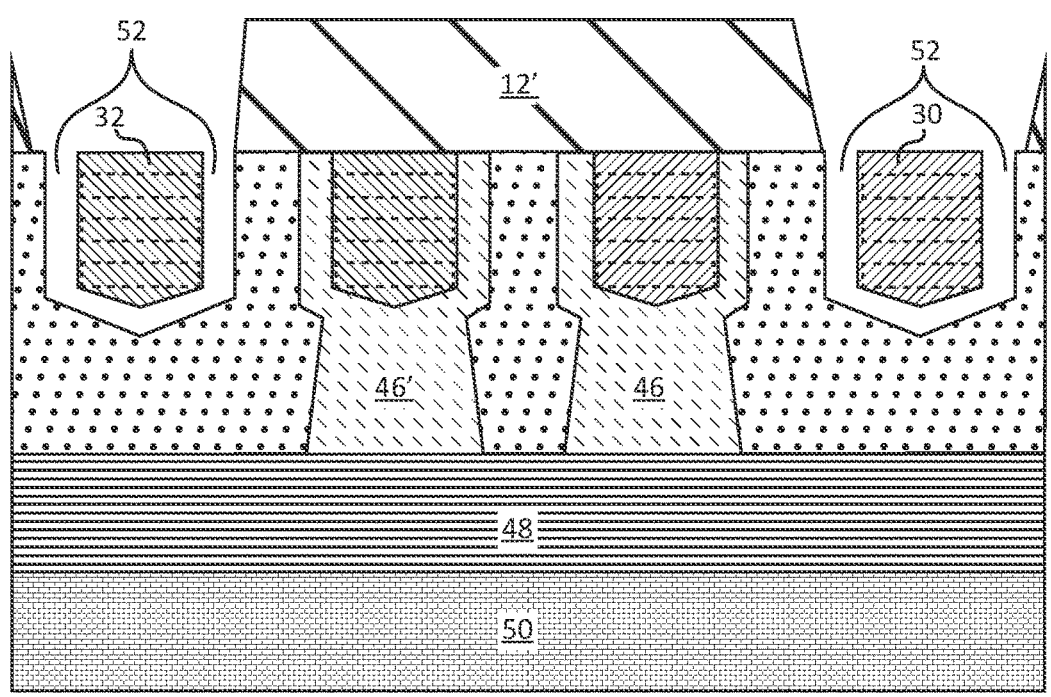
FIG. 7 is a cross-sectional view of the semiconductor structure of FIG. 6 where the buried oxide (BOX) layer is selectively etched to expose source/drain epi regions including remaining sacrificial liner, and where such remaining sacrificial liner is removed, in accordance with an embodiment of the present invention.

FIG. 7 is a cross-sectional view of the semiconductor structure of FIG. 6 where the buried oxide (BOX) layer is selectively etched to expose source/drain epi regions including remaining sacrificial liner, and where such remaining sacrificial liner is removed, in accordance with an embodiment of the present invention.

In various example embodiments, backside contact patterning is performed and the BOX layer 12 is selectively etched (to form remaining BOX layer 12') to expose source/drain epi regions 30, 32 including remaining sacrificial liner 40. The remaining sacrificial liner 40 is selectively removed to create openings 52 (or trenches 52) around the source/drain epi regions 30, 32. These are the source/drain epi regions 30, 32 that are not associated with CA contacts 46, 46'.

Figure 8:
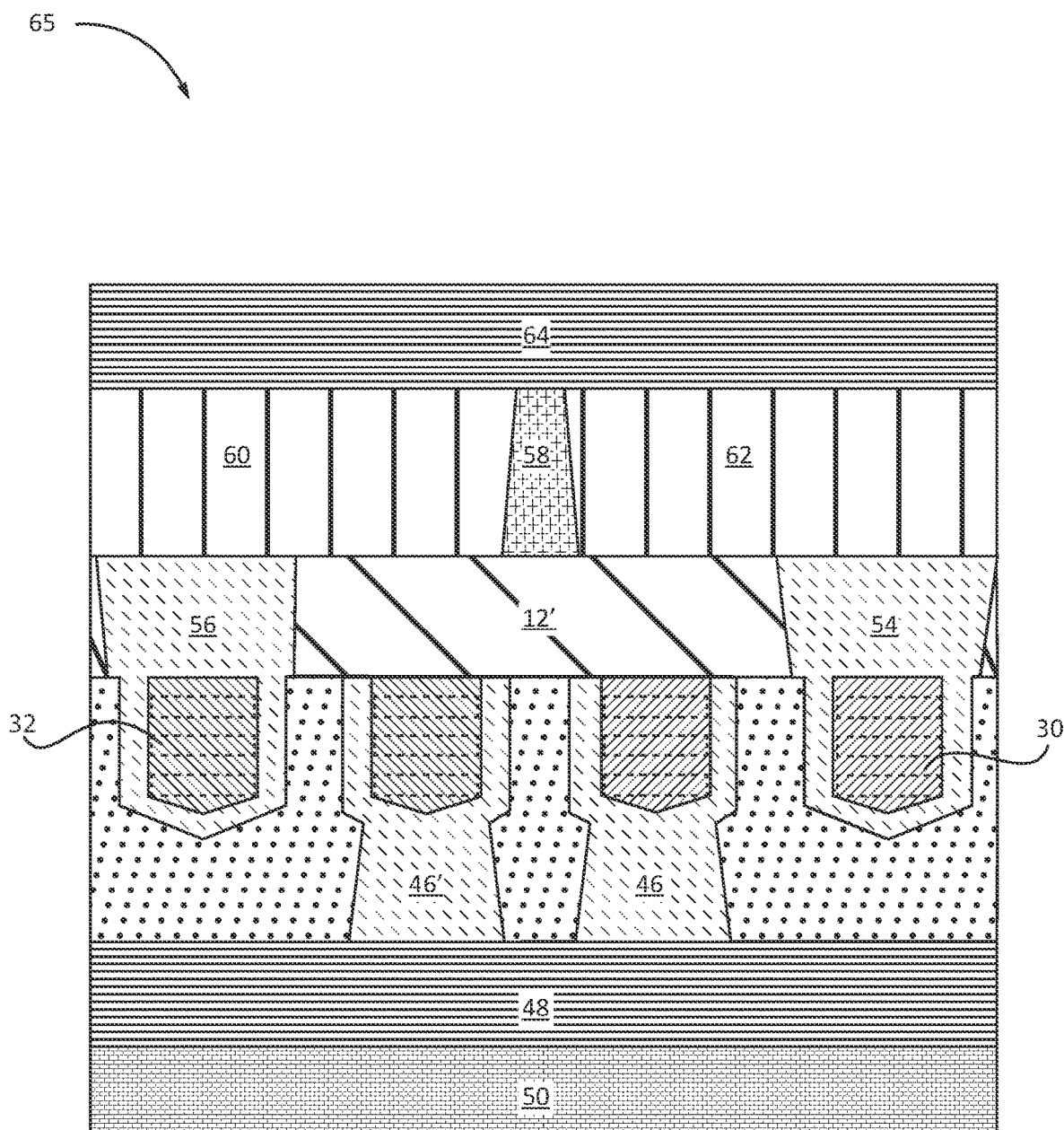
FIG. 8 is a cross-sectional view of the semiconductor structure of FIG. 7 where backside contact metallization takes place such that CA contacts are formed to completely surround the exposed source/drain epi regions, metal contacts are formed to the exposed CA contacts, and a backside power delivery network (BSPDN) is connected to the metal contacts, in accordance with an embodiment of the present invention.

FIG. 8 is a cross-sectional view of the semiconductor structure of FIG. 7 where backside contact metallization takes place such that CA contacts are formed to completely surround the exposed source/drain epi regions, metal contacts are formed to the exposed CA contacts, and a backside power delivery network (BSPDN) is connected to the metal contacts, in accordance with an embodiment of the present invention.

In various example embodiments, backside contact metallization takes place such that CA contacts 54, 56 are formed to advantageously completely surround the exposed source/drain epi regions 30, 32. The n-type source/drain epi region 30 is advantageously surrounded by CA contact 54 and the p-type source/drain epi region 32 is advantageously surrounded by CA contact 56. The CA contact 54 completely wraps around the n-type source/drain epi region 30 and the CA contact 56 completely wraps around the p-type source/drain epi region 32. The CA contact 54 directly contacts the first sidewall, the second sidewall, the top surface, and the bottom surface of the n-type source/drain epi region 30. Similarly, the CA contact 56 directly contacts the first sidewall, the second sidewall, the top surface, and the bottom surface of the p-type source/drain epi region 32.

The BOX 12' is horizontally aligned with a portion of the CA contacts 54, 56. Moreover, the first contact 46' is vertically offset from the second contact 56 for the p-type source/drain epi regions 32. Similarly, the first contact 46 is vertically offset from the second contact 54 for the n-type source/drain epi regions 30.

After that, backside ILD 58 is deposited, and backside power rails 60, 62 are formed to the exposed CA contacts 56, 54, respectively. In particular, backside power rail (VSS) 62 directly contacts CA contact 54 which connects to nFET S/D region 30 and backside power rail (VDD) 60 directly contacts CA contact 56 which connects to pFET S/D region 32, and the remaining backside ILD 58 separates the backside power rail (VSS) 62 from the backside power rail (VDD) 60. A backside power delivery network (BSPDN) 64 is connected to the backside power rail 60, 62 to complete the structure 65. CA contacts 54, 56 can also be referred to as wrap around contacts (WACs) or fully wrapped around backside contacts. CA contacts 54, 56 are further illustrated in the top view 7 of FIG. 1.

Therefore, in FIG. 8, a first source/drain (S/D) epi region 32 has a first contact 56 completely wrapping around the first S/D epi region 32, the first contact 56 electrically connected to a backside power delivery network (BSPDN) 64 and a second S/D epi region 32 has a second contact 46' directly contacting a first sidewall, a second sidewall, and a top surface of the second S/D epi region 32, the second contact 46' electrically connected to back-end-of-line (BEOL) components 48.

Figure 9:
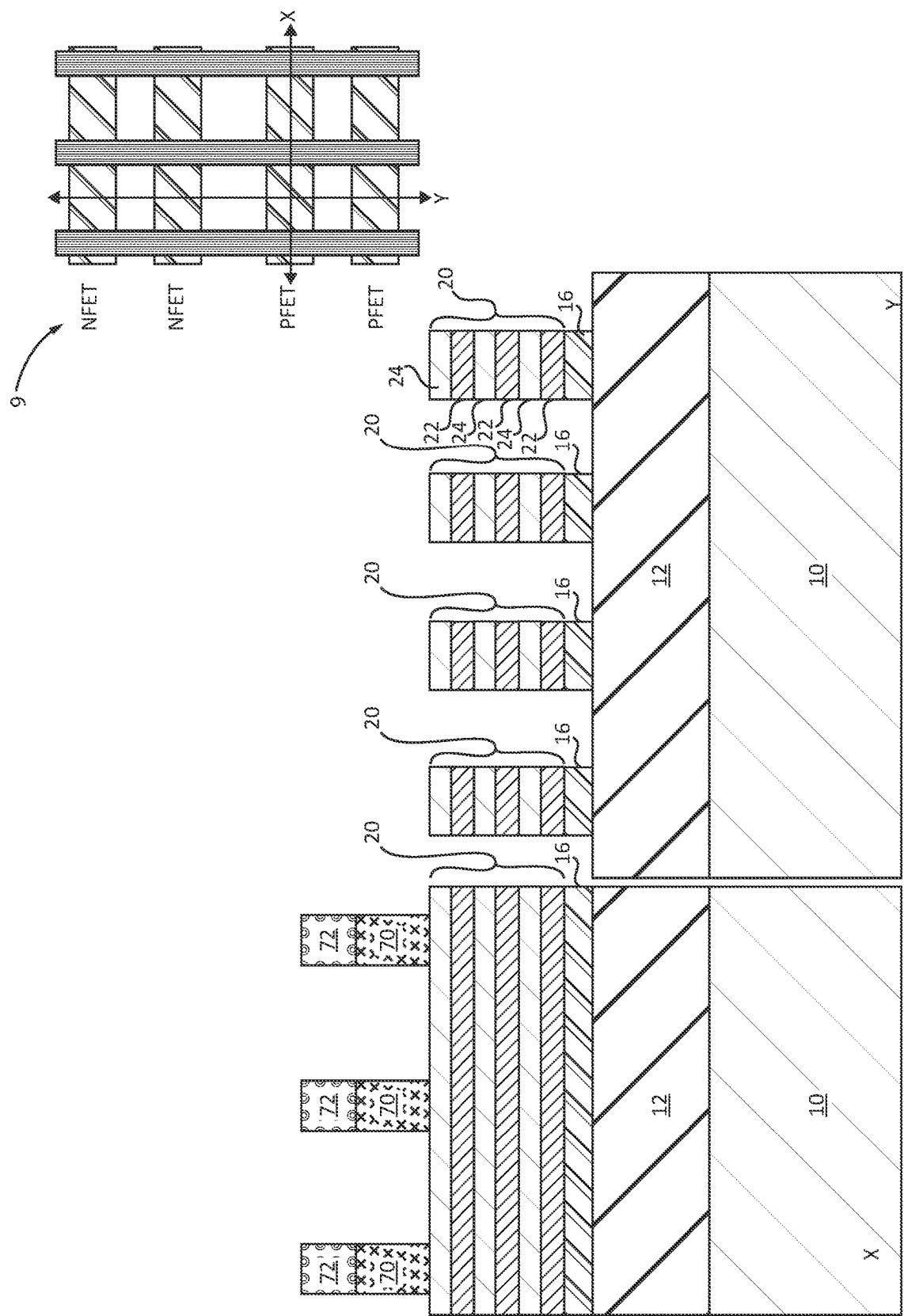
FIG. 9 is a cross-sectional view of a semiconductor structure where a dummy gate with a gate hardmask are formed over a nanosheet stack, in accordance with another embodiment of the present invention.

FIG. 9 is a cross-sectional view of a semiconductor structure where a dummy gate with a gate hardmask are formed over a nanosheet stack, in accordance with another embodiment of the present invention.

In various example embodiments, a dummy gate 70 with a gate hardmask 72 are formed over a nanosheet stack 20 in the X-cut direction. In the Y-cut direction, the nanosheet stacks 20 are visible. The nanosheet stacks are formed over a BOX layer 12, which in turn is formed over a substrate 10. The nanosheet stacks 20 are formed over a silicon germanium (SiGe) layer 16 with a high concentration of germanium (Ge).

The top view 9 illustrates the NFETs and the PFETs.

Dummy gate 70 materials include, but are not limited to, a thin layer of dummy oxide $SiO_2$ followed by any one or more of amorphous or polycrystalline Si, $SiO_2$, SiON, SiGe, Ge, $GeO_2$, amorphous C, BC, CN, etc.

In various embodiments, the hardmask layer 72 can be a nitride, for example, a silicon nitride (SiN), an oxynitride, for example, silicon oxynitride (SiON), or a combination thereof.

Figure 10:
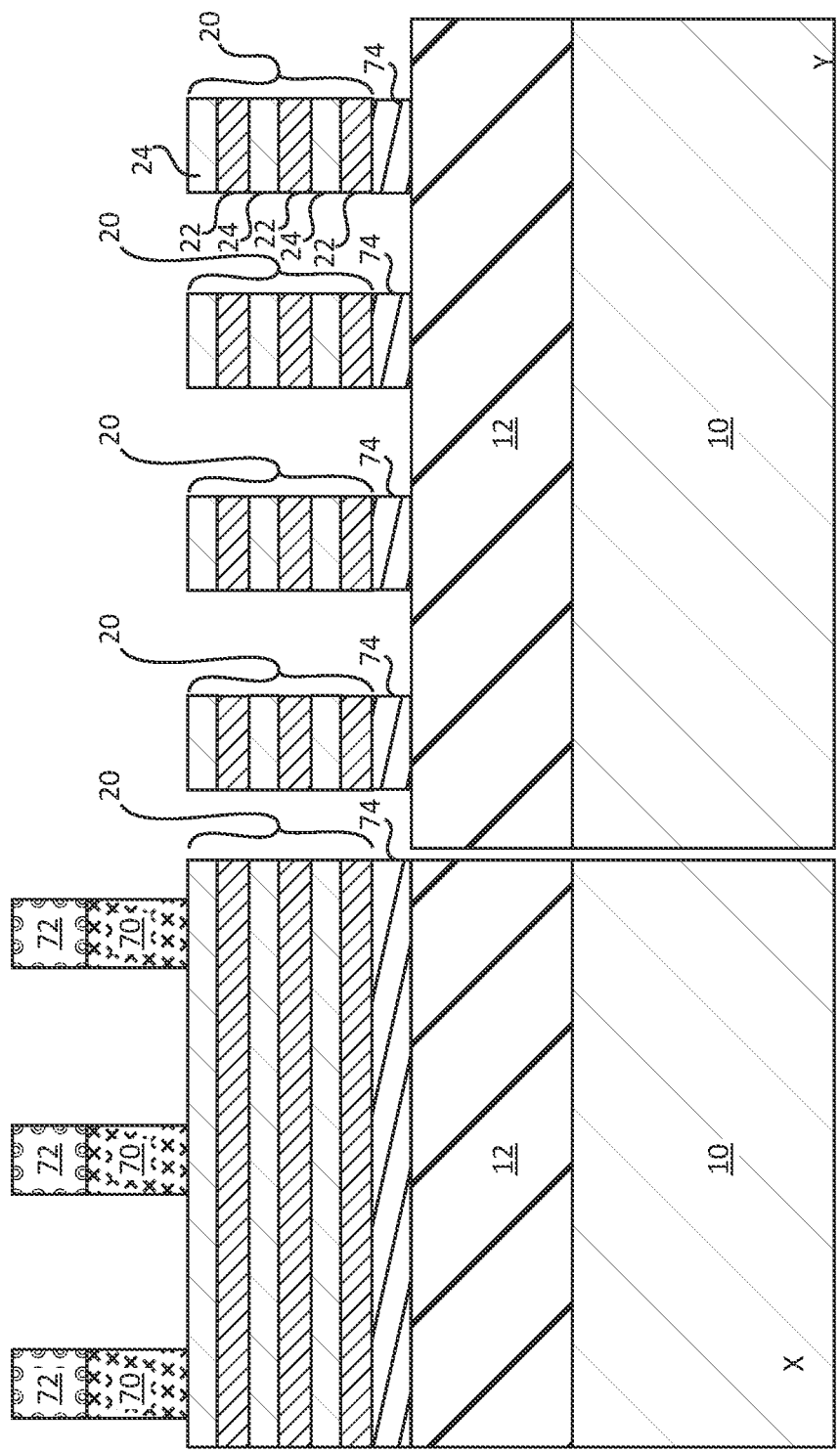
FIG. 10 is a cross-sectional view of the semiconductor structure of FIG. 9 where a silicon germanium (SiGe) layer with a high concentration of germanium (Ge) is removed and replaced with a bottom dielectric isolation (BDI) layer, in accordance with an embodiment of the present invention.

FIG. 10 is a cross-sectional view of the semiconductor structure of FIG. 9 where a silicon germanium (SiGe) layer with a high concentration of germanium (Ge) is removed and replaced with a bottom dielectric isolation (BDI) layer, in accordance with an embodiment of the present invention.

In various example embodiments, the silicon germanium (SiGe) layer 16 with a high concentration of germanium (Ge) is removed and replaced with a bottom dielectric isolation (BDI) layer 74.

The BDI layer 74 can include, e.g., SiC, SiOC, etc. The BDI layer 74 can be deposited by, e.g., ALD with an isotropic etch back.

Figure 11:
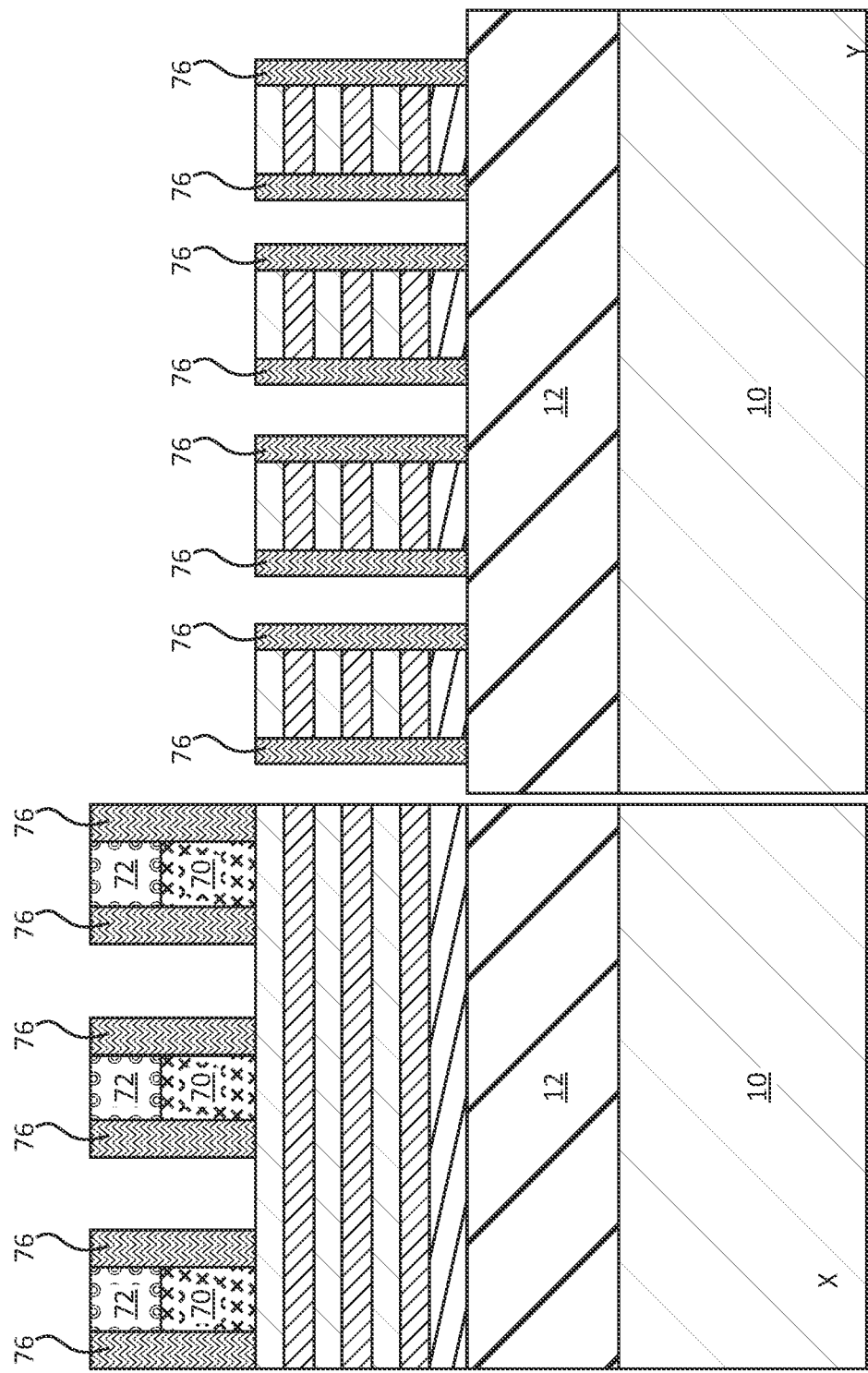
FIG. 11 is a cross-sectional view of the semiconductor structure of FIG. 10 where spacers are formed adjacent the nanosheet stacks in the Y-cut direction and where spacers are formed adjacent the dummy gate with hardmask in the X-cut direction, in accordance with an embodiment of the present invention.

FIG. 11 is a cross-sectional view of the semiconductor structure of FIG. 10 where spacers are formed adjacent the nanosheet stacks in the Y-cut direction and where spacers are formed adjacent the dummy gate with hardmask in the X-cut direction, in accordance with an embodiment of the present invention.

In various example embodiments, spacers 76 are formed adjacent the nanosheet stacks 20 in the Y-cut direction and spacers 76 are formed adjacent the dummy gate 70 with hardmask 72 in the X-cut direction.

The spacers 76 can include any of one or more of SiN, SiBN, SiCN and/or SiBCN films.

Figure 12:
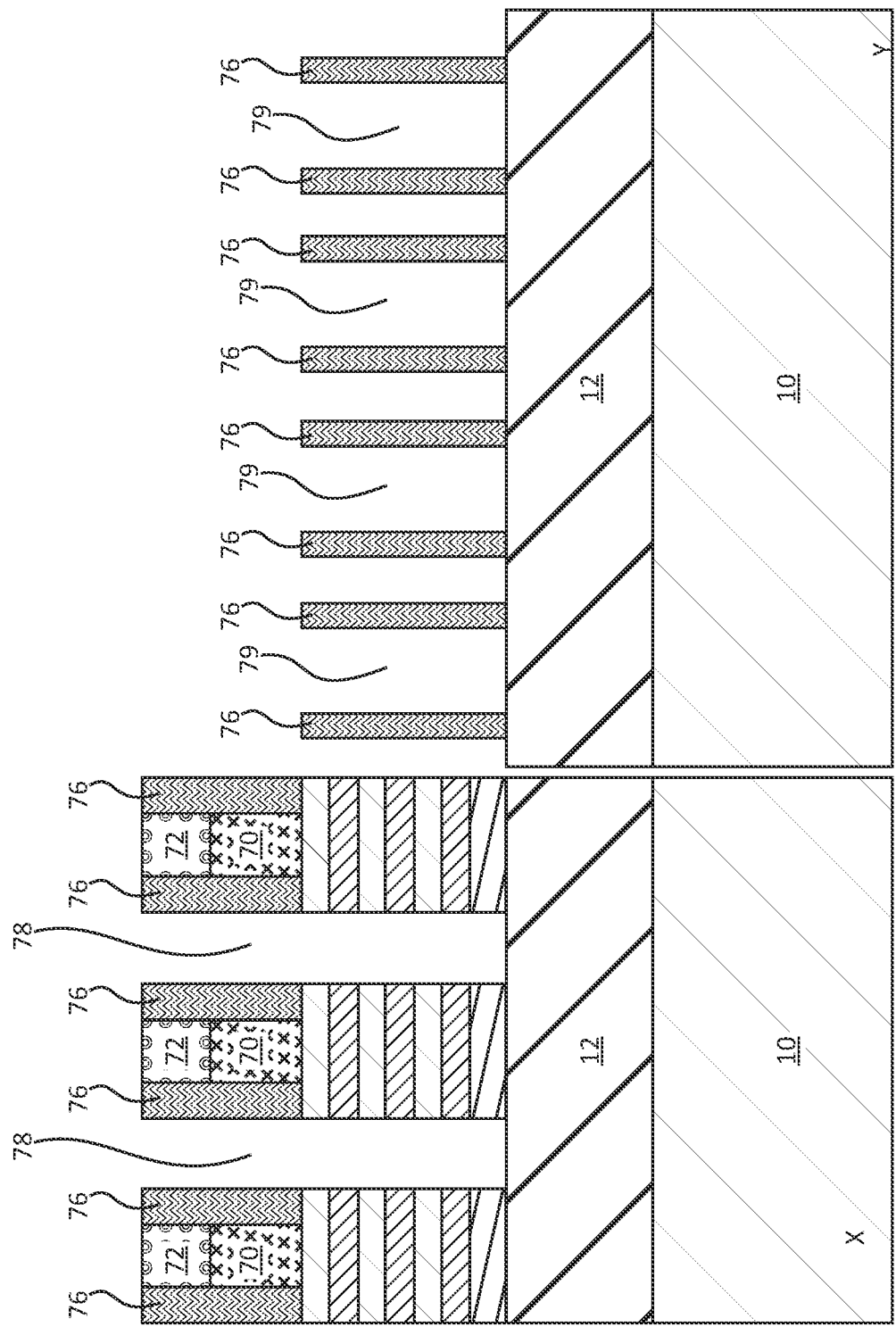
FIG. 12 is a cross-sectional view of the semiconductor structure of FIG. 11 where the nanosheet stacks are recessed, in accordance with an embodiment of the present invention.

FIG. 12 is a cross-sectional view of the semiconductor structure of FIG. 11 where the nanosheet stacks are recessed, in accordance with an embodiment of the present invention.

In various example embodiments, the nanosheet stacks are recessed such that nanosheet stacks are not visible in the Y-cut direction. Openings 78 are visible in the X-cut direction and openings 79 are visible between the spacers 76 in the Y-cut direction.

Figure 13:
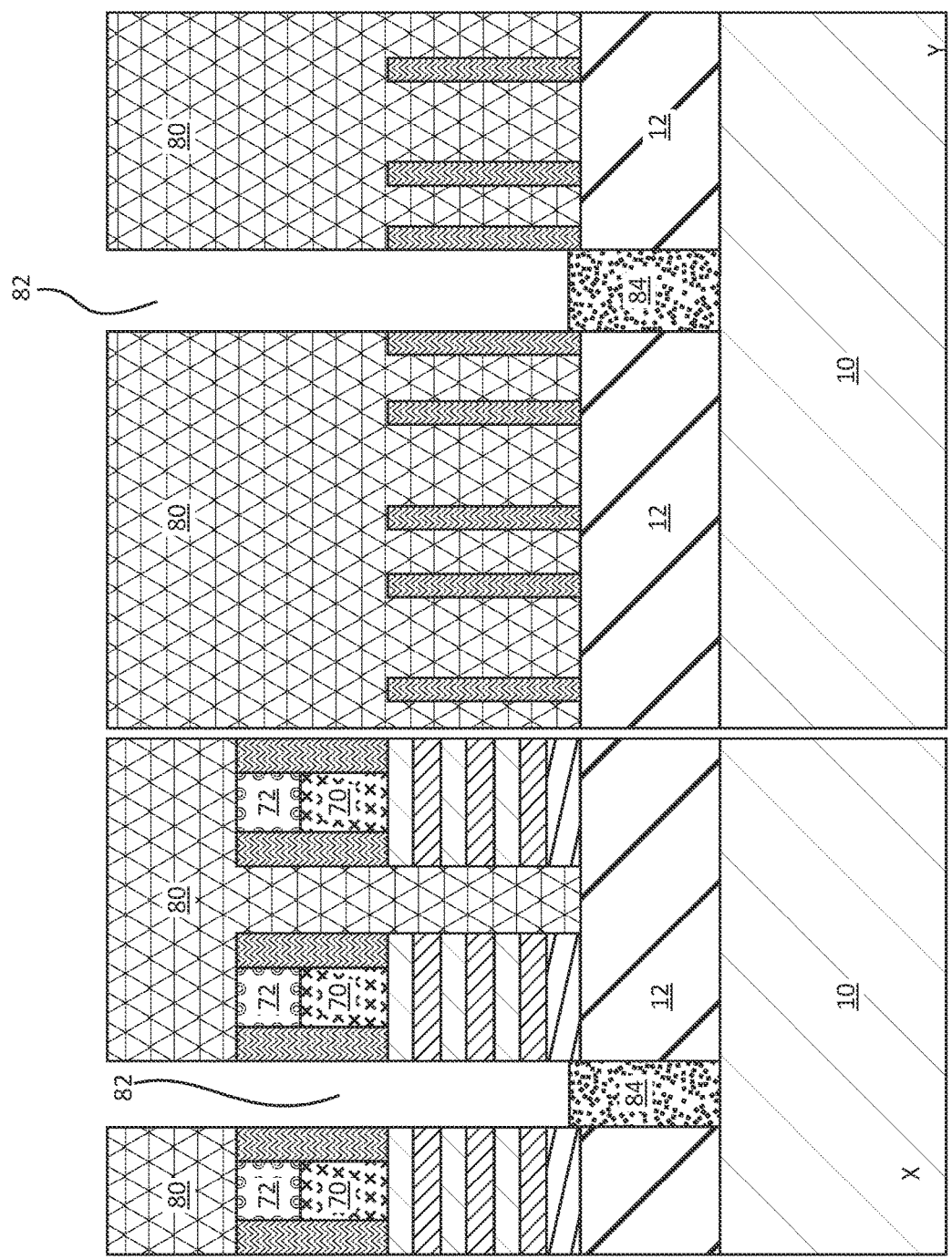
FIG. 13 is a cross-sectional view of the semiconductor structure of FIG. 12 where an organic planarization layer (OPL) is selectively deposited, openings are formed to a top surface of the substrate, and a sacrificial layer is deposited at a bottom portion of the openings such that the sacrificial layer extends slightly above the BOX layer, in accordance with an embodiment of the present invention.

FIG. 13 is a cross-sectional view of the semiconductor structure of FIG. 12 where an organic planarization layer (OPL) is selectively deposited, openings are formed to a top surface of the substrate, and a sacrificial layer is deposited at a bottom portion of the openings such that the sacrificial layer extends slightly above the BOX layer, in accordance with an embodiment of the present invention.

In various example embodiments, an organic planarization layer (OPL) 80 is selectively deposited and openings 82 (or trenches 82) are formed to a top surface of the substrate 10. Then, a sacrificial layer 84 is deposited at a bottom portion of the openings 82 such that the sacrificial layer 84 extends slightly above the BOX layer 12. The sacrificial layer 84 is visible in both the X-cut direction and the Y-cut direction. The sacrificial layer 84 does not extend to the bottom surface of the nanosheet stacks 20.

The OPL 80 can include an organic material, such as a polymer. The thickness of the OPL 80 can be in a range from about 10 nm to about 300 nm. In one example, the thickness of the OPL 80 is about 100 nm-150 nm.

Figure 14:
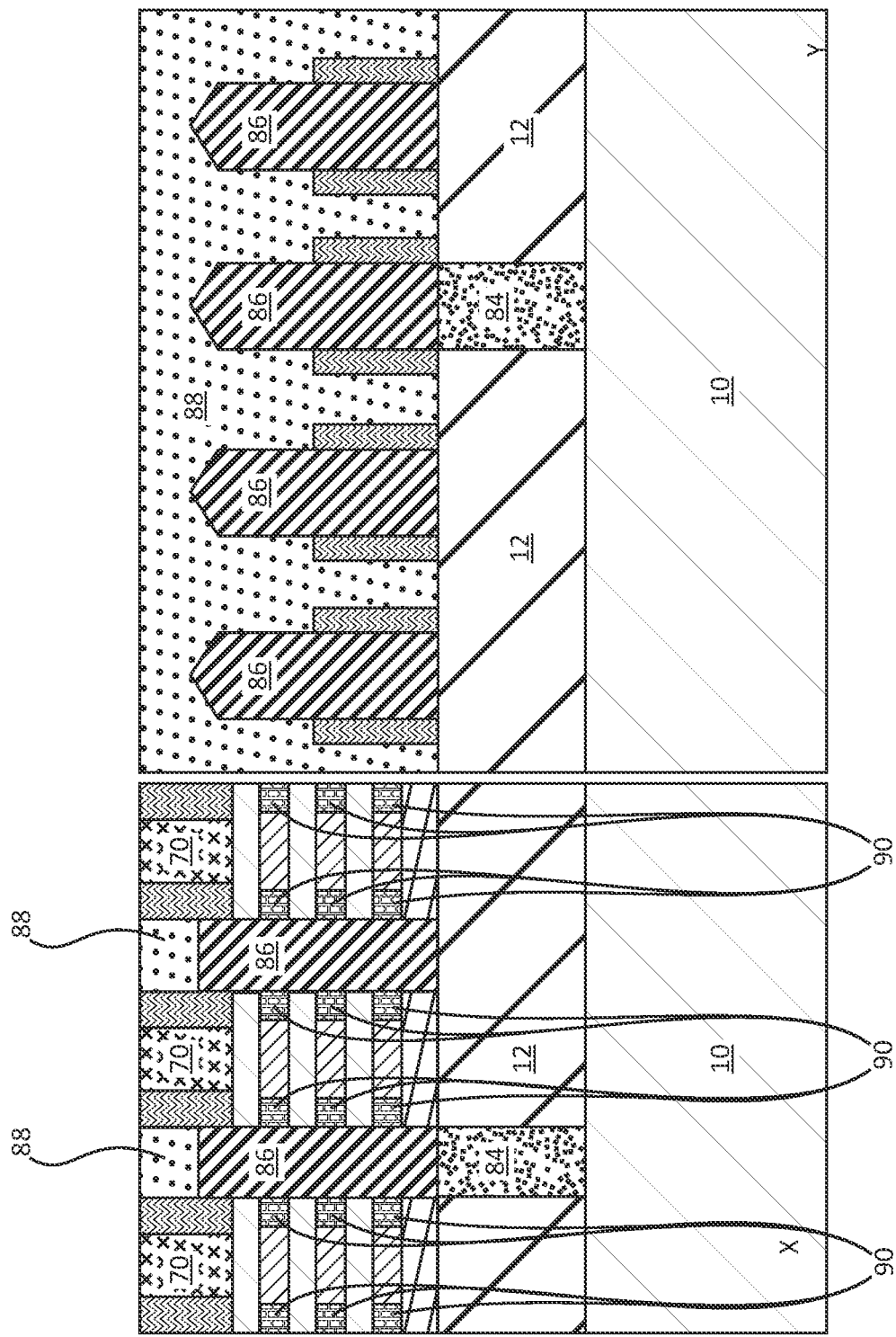
FIG. 14 is a cross-sectional view of a semiconductor structure similar to FIG. 13 where S/D epi regions are formed over the sacrificial layers, as well as over the BOX layer, and an ILD layer is deposited, in accordance with an embodiment of the present invention.

FIG. 14 is a cross-sectional view of a semiconductor structure similar to FIG. 13 where S/D epi regions are formed over the sacrificial layers, as well as over the BOX layer, after that, the spacer 76 at sidewalls of the S/D epi is etched down with reduced height, and an ILD layer is deposited, in accordance with an embodiment of the present invention.

In various example embodiments, S/D epi regions 86 are formed over the sacrificial layers 84, as well as over the BOX layer 12. An ILD layer 88 is then deposited over the S/D epi regions 86. The ILD layer 88 fully encompasses or surrounds the S/D epi regions 86. Inner spacers 90 are also formed in the X-cut direction adjacent the sacrificial SiGe layers 22.

In various exemplary embodiments, the height of the ILD layer 88 and the dummy gates 70 can be reduced by chemical-mechanical polishing (CMP) and/or etching. Therefore, the planarization process can be provided by CMP. Other planarization process can include grinding and polishing.

Figure 15:
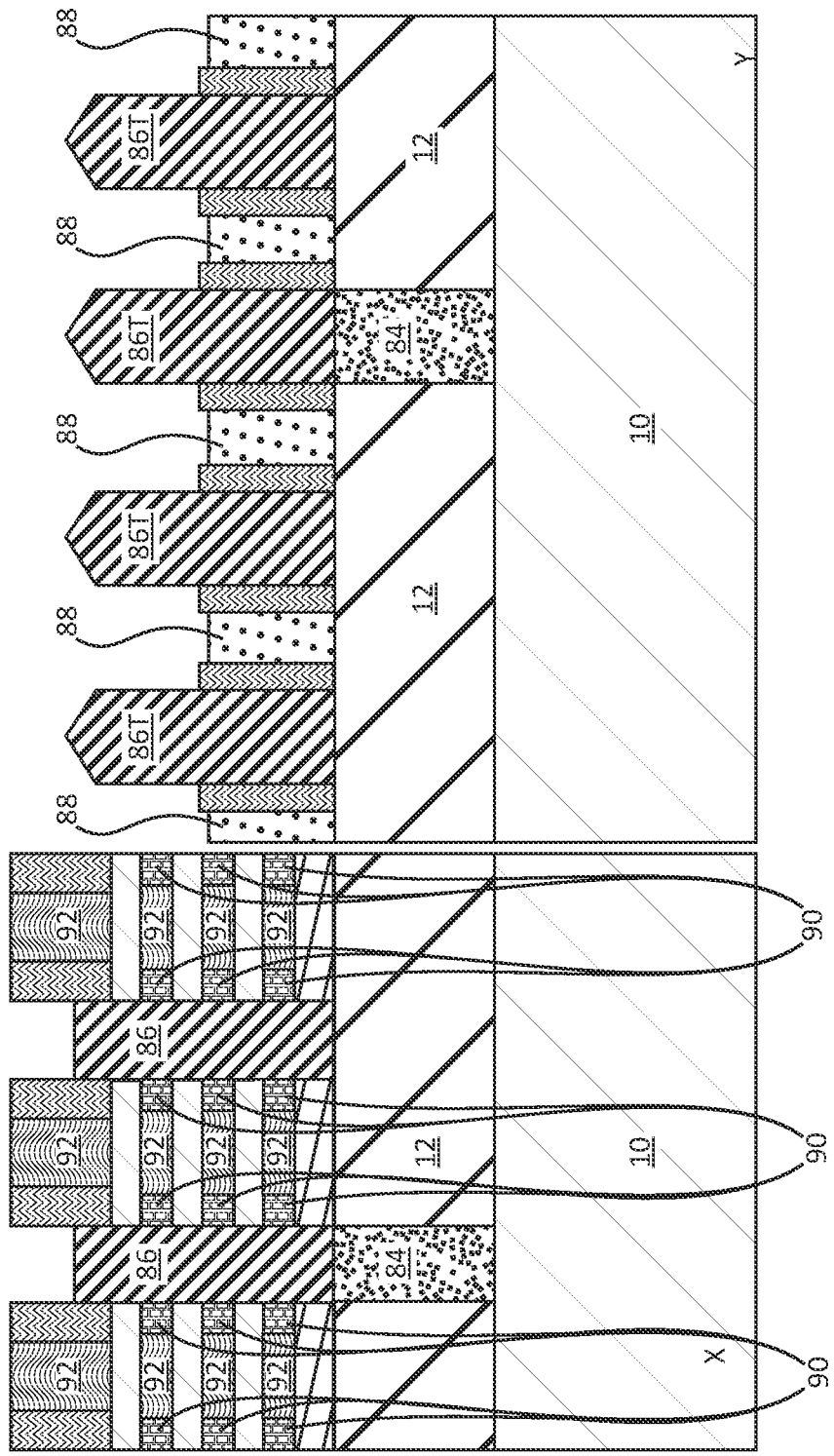
FIG. 15 is a cross-sectional view of the semiconductor structure of FIG. 14 where the dummy gates are selectively removed, replacement metal gates are formed in the X-cut direction, and the ILD is selectively removed, in accordance with an embodiment of the present invention.

FIG. 15 is a cross-sectional view of the semiconductor structure of FIG. 14 where the dummy gates are selectively removed, replacement metal gates are formed in the X-cut direction, and the ILD is selectively removed, in accordance with an embodiment of the present invention.

In various example embodiments, the dummy gates 70 are selectively removed and replacement metal gates 92 are formed in the X-cut direction. Then the ILD layer 88 is selectively recessed to the depth close to the height of remaining S/D epi sidewall spacer 76, resulting in the exposure of the top section 86T of the S/D epi regions 86.

The high-k metal gate material of the replacement metal gates 92 can be deposited by any suitable techniques, such as ALD, CVD, metal-organic CVD (MOCVD), physical vapor deposition (PVD), thermal oxidation, combinations thereof, or other suitable techniques. The replacement metal gates 92 can include a gate dielectric layer, e.g., $Hfn_2$, LaO, AlO, ZrO, TiO, $Ta_2O_5$, $Y_2O_3$, $SrTiO_3$(STO), $BaTiO_3$ (BTO), BaZrO, HfZrO, HfLaO, HfSiO, LaSiO, AlSiO, HfTaO, HfTiO, $(Ba,Sr)TiO_3$(BST), $Al_2O_3$, $Si_3N_4$, oxynitrides (SiON), or other suitable materials. RMG gate 92 further includes work function metals, such as TiN, TiC, TiAl, TiAlC, etc., and conductive metal fills such as W, Al, or Ru.

The inner spacers 90 can include any of one or more of SiN, SiBN, SiCN and/or SiBCN films.

Figure 16:
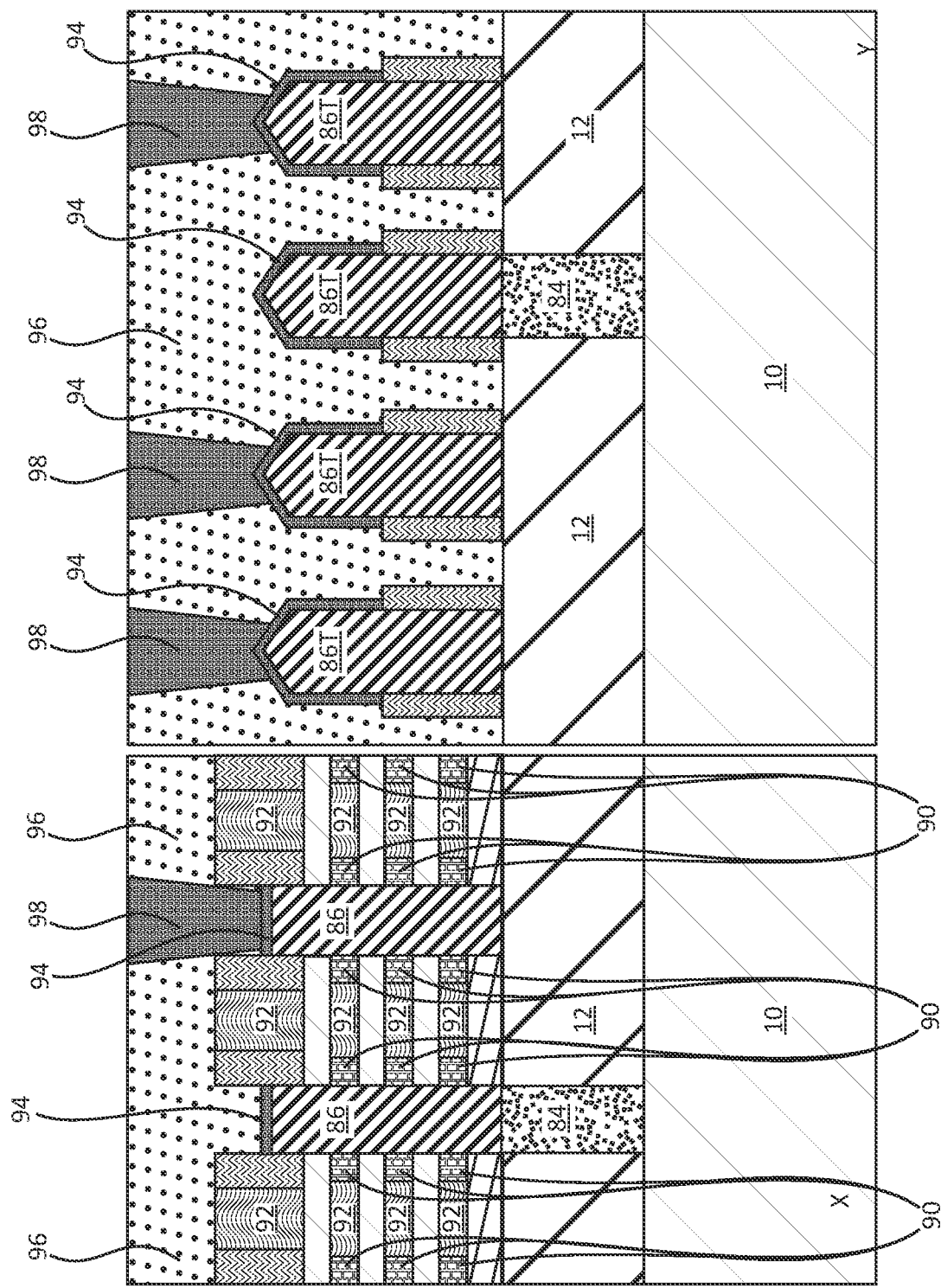
FIG. 16 is a cross-sectional view of the semiconductor structure of FIG. 15 where salicide is formed over the exposed S/D epi regions, another ILD is deposited, and CA contacts are formed to a top surface of salicide, in accordance with an embodiment of the present invention.

FIG. 16 is a cross-sectional view of the semiconductor structure of FIG. 15 where salicide is formed over the exposed S/D epi regions, another ILD is deposited, and CA contacts are formed to a top surface of salicide, in accordance with an embodiment of the present invention.

In various example embodiments, a salicide 94 is advantageously formed over the exposed S/D epi regions 86 (that is top sections 86T). In the X-cut direction, the salicide 94 is shown to be substantially flat, whereas in the Y-cut direction the salicide 94 is shown to surround the top sections 86T of the S/D epi regions 86. Salicide is formed by first depositing a metal liner, such as Ti, Ni, NiPt, and metal liner will react with S/D epi to form silicide, such as TiSi, NiSi, or NiPtSi, and after that, unreacted metals are removed from selective etch process.

Then another ILD 96 is deposited and CA contacts 98 are advantageously formed to a top surface of the salicide. The CA contacts 98 advantageously directly contact the top surface of the salicide 94. The S/D epi regions 86 that are vertically aligned with the sacrificial layers 84 do not include any CA contacts 98. This step can be referred to as a MOL contact formation.

In various exemplary embodiments, the height of the ILD 96 can be reduced by chemical-mechanical polishing (CMP) and/or etching. Therefore, the planarization process can be provided by CMP. Other planarization process can include grinding and polishing.

The term salicide refers to a technology used in the microelectronics industry used to form electrical contacts between the semiconductor device and the supporting interconnect structure. The salicide process involves the reaction of a metal thin film with silicon in the active regions of the device, ultimately forming a metal silicide contact through a series of annealing and/or etch processes. The term "salicide" is a compaction of the phrase self-aligned silicide. The description "self-aligned" suggests that the contact formation does not require photolithography patterning processes, as opposed to a non-aligned technology such as polycide.

Figure 17:
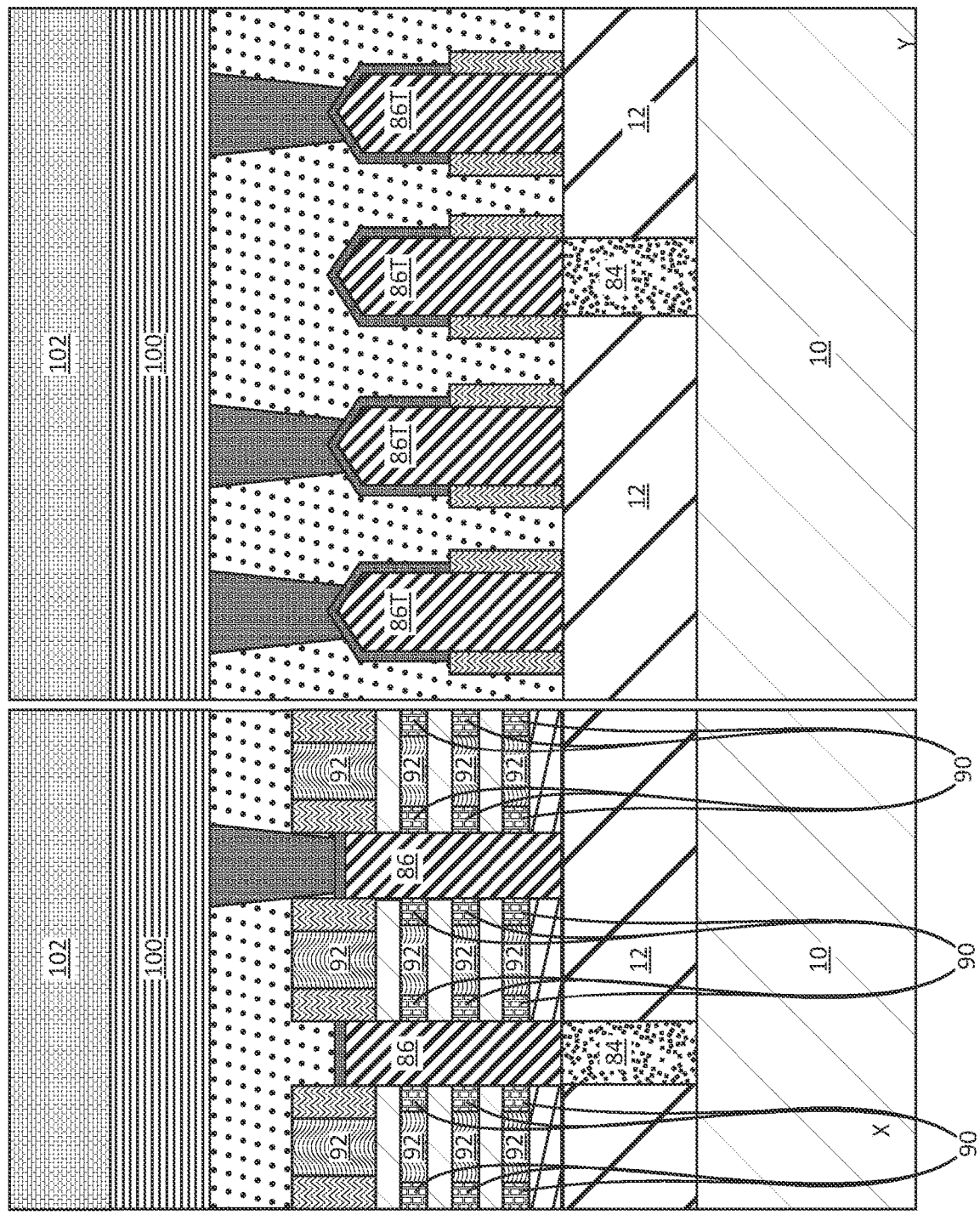
FIG. 17 is a cross-sectional view of the semiconductor structure of FIG. 16 where BEOL processing takes place and a carrier wafer is bonded to the BEOL, in accordance with an embodiment of the present invention.

FIG. 17 is a cross-sectional view of the semiconductor structure of FIG. 16 where BEOL processing takes place and a carrier wafer is bonded to the BEOL, in accordance with an embodiment of the present invention.

In various example embodiments, BEOL processing 100 takes place and a carrier wafer 102 is bonded to the BEOL 100.

Figure 18:
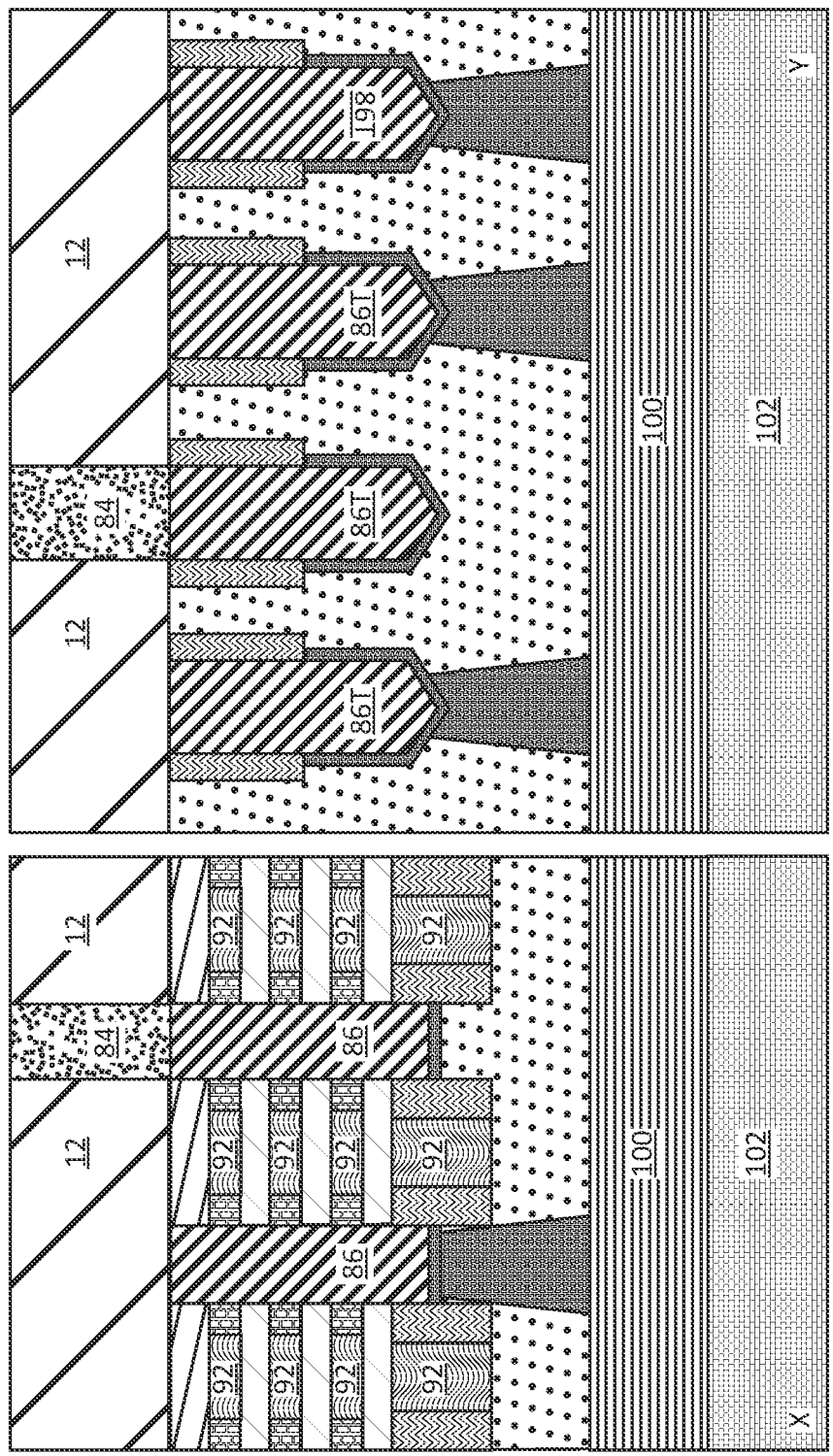
FIG. 18 is a cross-sectional view of the semiconductor structure of FIG. 17 where the structure is flipped and the substrate is removed to expose the sacrificial layers, in accordance with an embodiment of the present invention.

FIG. 18 is a cross-sectional view of the semiconductor structure of FIG. 17 where the structure is flipped and the substrate is removed to expose the sacrificial layers, in accordance with an embodiment of the present invention.

In various example embodiments, the structure is flipped and the substrate 10 is removed to expose the sacrificial layers 84 as well as the BOX layer 12.

Figure 19:
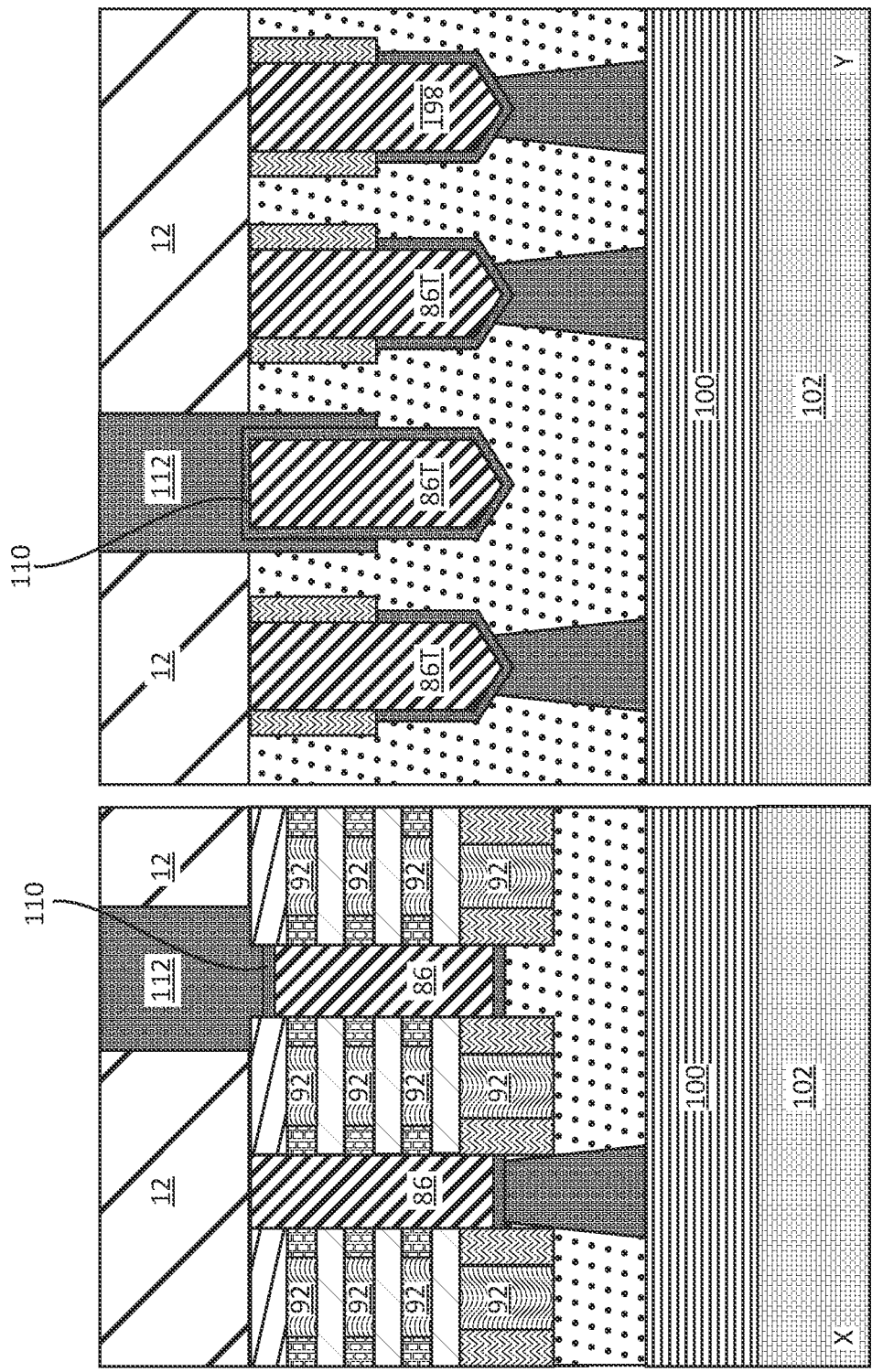
FIG. 19 is a cross-sectional view of the semiconductor structure of FIG. 18 where the sacrificial layers are removed, a lateral oxide etch takes place, a set of spacers is selectively removed, and CA contacts are formed, in accordance with an embodiment of the present invention.

FIG. 19 is a cross-sectional view of the semiconductor structure of FIG. 18 where the sacrificial layers are removed, a lateral oxide etch takes place, a set of spacers is selectively removed, and CA contacts are formed, in accordance with an embodiment of the present invention.

In various example embodiments, the sacrificial layers 84 are removed and a lateral oxide etch advantageously takes place to create a bigger opening and increase the contact critical dimension (CD). The bigger opening or bigger CD due to the lateral oxide etch advantageously results in the exposure of the BDI layer 74 in the X-cut direction and exposure of the spacers 76 in the Y-cut direction. The set of exposed spacers 76 (due to the lateral oxide etch) is selectively removed, and CA contacts 112 are formed. During backside contact 112 formation, a silicide 110 is also formed between the contact 112 and S/D epi 86.

In the X-cut direction, the silicide 110 is shown to be substantially flat and in the Y-cut direction, the silicide 110 surrounds the exposed S/D epi region 86. In the Y-cut direction, the CA contact 112 extends vertically within the openings created by the removal of the set of spacers 76. The CA contact 122 thus wraps around at least a portion of the exposed S/D epi region 86. It is contemplated that some of the silicide 110 can advantageously directly contact some of the salicide 94. As a result, a portion of the exposed S/D epi region 86 in the Y-cut direction is advantageously surrounded by the salicide 94 and a portion of the exposed S/D epi region 86 is advantageously surrounded by the silicide 110.

Figure 20:
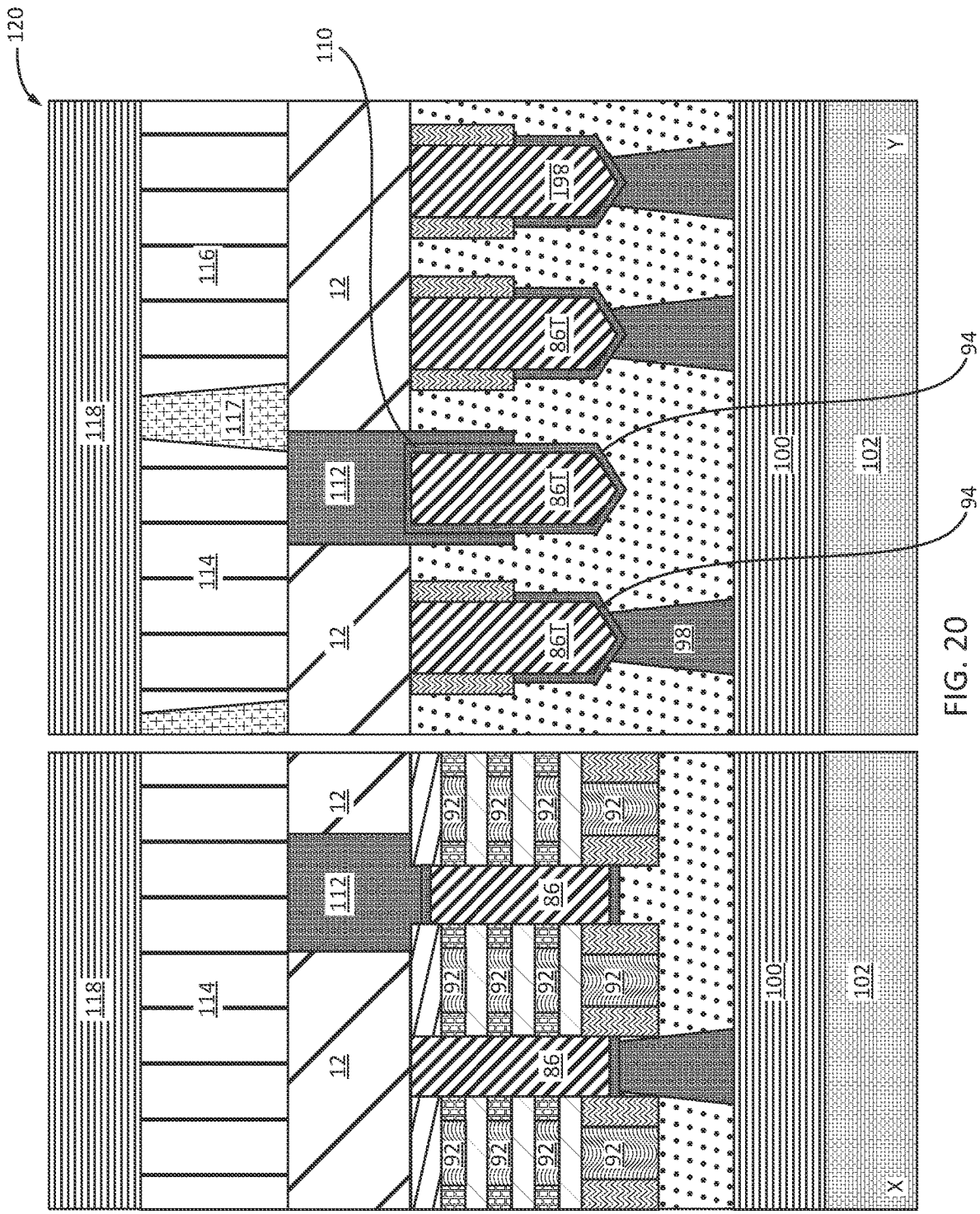
FIG. 20 is a cross-sectional view of the semiconductor structure of FIG. 19 where backside power rail are formed to the exposed CA contacts and a backside power delivery network (BSPDN) is connected to the backside power rails, in accordance with an embodiment of the present invention.

FIG. 20 is a cross-sectional view of the semiconductor structure of FIG. 19 where backside power rail are formed to the exposed CA contacts and a backside power delivery network (BSPDN) is connected to the backside power rails, in accordance with an embodiment of the present invention.

In various example embodiments, backside power rails 114, 116 are formed to the exposed CA contacts 112 and a backside power delivery network (BSPDN) 118 is connected to the backside power rails 114, 116 to form structure 120. An ILD 117 can separate backside power rails 114 (VDD) from backside power rail 116 (VSS).

Therefore, in FIG. 20, a first source/drain (S/D) epi region 86 having a salicide wrapping 94 and a silicide wrapping 110, and a first contact 112 wrapping around the silicide wrapping 110 of the first S/D epi region 86, the first contact 112 electrically connected to a backside power delivery network (BSPDN) 118 and a second S/D epi region 86 having a partial salicide wrapping 94, and a second contact 98 electrically connected to back-end-of-line (BEOL) components 100. The partial salicide wrapping 94 of the second S/D epi region 86 directly contacts the second contact 98, whereas the silicide wrapping 110 of the first S/D epi region 86 directly contacts the first contact 112. The BOX 12 is horizontally aligned with a portion of the CA contact 112. Moreover, the first contact 46' is vertically offset from the second contact 56 for the p-type source/drain epi regions 32. Similarly, the first contact 98 is vertically offset from the second contact 112 for the source/drain epi regions 86.

Regarding various dielectrics or dielectric layers discussed herein, the dielectrics can include, but are not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectrics can be conformally deposited using atomic layer deposition (ALD) or, chemical vapor deposition (CVD). Variations of CVD processes suitable for forming the dielectrics include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

In conclusion, the exemplary embodiments of the present invention present a backside wrap around contact, which increases the silicide area to mitigate conventional issues such as higher contact resistance because high temperature anneal cannot be performed when BEOL interconnects are built on the front side of the wafer. The exemplary embodiments of the present invention form a silicide wrapping around the S/D epi regions. Stated differently, the present invention improves the backside contact for backside power rail and backside power delivery network technology by increasing the silicide area. The silicide area is advantageously positioned around select S/D epi regions.

Regarding FIGS. 1-20, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and structures providing for constructing a full wrap around backside contact (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
   a first source/drain (S/D) epi region having a first contact completely wrapping around the first S/D epi region, the first contact electrically connected to a backside power delivery network (BSPDN); and
   a second S/D epi region having a second contact directly contacting a first sidewall, a second sidewall, and a top surface of the second S/D epi region and being horizontally aligned with the first S/D epi region, the second contact electrically connected to back-end-of-line (BEOL) components.

2. The semiconductor structure of claim 1, wherein a bottom surface of the second S/D epi region directly contacts a buried oxide layer.

3. The semiconductor structure of claim 2, wherein the buried oxide layer is horizontally aligned with a portion of the first contact.

4. The semiconductor structure of claim 1, wherein the first contact is vertically offset from the second contact.

5. The semiconductor structure of claim 1, wherein the first S/D epi region and the second S/D epi region are both n-type epi regions.

6. The semiconductor structure of claim 1, wherein the first S/D epi region and the second S/D epi region are both p-type epi regions.

7. A semiconductor structure comprising:
   a first source/drain (S/D) epi region having a salicide wrapping and a silicide wrapping, and a first contact wrapping around the silicide wrapping of the first S/D epi region, the first contact electrically connected to a backside power delivery network (BSPDN); and
   a second S/D epi region having a partial salicide wrapping, and a second contact electrically connected to back-end-of-line (BEOL) components.

8. The semiconductor structure of claim 7, wherein the partial salicide wrapping of the second S/D epi region directly contacts the second contact.

9. The semiconductor structure of claim 7, wherein the silicide wrapping of the first S/D epi region directly contacts the first contact.

10. The semiconductor structure of claim 7, wherein a bottom surface of the second S/D epi region directly contacts a buried oxide layer.

11. The semiconductor structure of claim 10, wherein the buried oxide layer is horizontally aligned with a portion of the first contact.

12. The semiconductor structure of claim 7, wherein the first contact is vertically offset from the second contact.

13. The semiconductor structure of claim 7, wherein the first S/D epi region is horizontally aligned with the second S/D epi region.

14. The semiconductor structure of claim 7, wherein a bottom dielectric isolation (BDI) layer directly contacts both the first contact and the silicide wrapping of the first S/D epi region.

15. A semiconductor structure comprising:
- a first source/drain (S/D) epi region having a partial silicide wrapping, and a first contact wrapping around the silicide wrapping of the first S/D epi region;
- a second S/D epi region having a partial salicide wrapping, and a second contact that is prevented from extending along sidewalls of the second S/D epi region; and
- a bottom dielectric isolation (BDI) that directly contacts both the first contact and the partial silicide wrapping of the first S/D epi region.

16. The semiconductor structure of claim 15, wherein the first contact is electrically connected to a backside power delivery network (BSPDN) and the second contact is electrically connected to back-end-of-line (BEOL) components.

17. The semiconductor structure of claim 15, wherein a bottom surface of the second S/D epi region directly contacts a buried oxide layer.

18. The semiconductor structure of claim 17, wherein the buried oxide layer is horizontally aligned with a portion of the first contact.

* * * * *